United States Patent [19]

Allred et al.

[11] Patent Number: 5,226,067
[45] Date of Patent: Jul. 6, 1993

[54] NOVEL COATING FOR PREVENTING COATING FOR PREVENTING CORROSION TO BERYLLIUM X-RAY WINDOWS AND METHOD OF PREPARING

[75] Inventors: David D. Allred; Fang Yuan, both of Provo, Utah; Irwin Rudich, Wilton, Conn.

[73] Assignees: Brigham Young University; Multilayer Optics and X-Ray Technology, Inc., both of Provo, Utah

[21] Appl. No.: 847,588

[22] Filed: Mar. 6, 1992

[51] Int. Cl.[5] .............................................. G21K 1/00
[52] U.S. Cl. .................................... 378/161; 378/140
[58] Field of Search ................................ 378/161, 140

[56] References Cited

U.S. PATENT DOCUMENTS 3,741,797  0/0000  Chavasse, Jr. et al. .

OTHER PUBLICATIONS

Roca i Cabarrocas, P., S. Kumar, and B. Drevillon, "In situ study of the thermal decomposition of $B_2H_6$ by combining spectroscopic ellipsometry and Kelvin probe measurements," J. Appl. Phys. 66, 3286 (1989).

Comfort, J. H., "Plasma-enhanced chemical vapor deposition of in situ doped epitaxial silicon at low temperatures," J. Appl. Phys. 65, 1067 (1989).

Hanigofsky, J. A., K. L. More, and W. J. Lackey, "Composition and microstructure of chemically vapor-deposited boron nitride, aluminum nitride, and boron nitride + aluminum nitride composites," J. Amer. Ceramic Soc. 74, 301 (1991).

Komatsu, S., and Y. Moriyoshi, "Influence of atomic hydrogen on the growth reactions of amorphous boron films in a low-pressure $B_2H_6+He+H_2$ plasma", J. Appl. Phys. 64, 1878 (1988).

Komatsu, S., and Y. Moriyoshi, "Transition from amorphous to crystal growth of boron films in plasma-enhanced chemical vapor deposition with $B_2H_6+He$," J. Appl. Phys., 66, 466 (1989).

Komatsu, S., and Y. Moriyoshi, "Transition from thermal-to electron-impact decomposition of diborane in plasma-enhanced chemical vapor deposition of boron films from $B_2H_6+He$," J. Appl. Phys. 66, 1180 (1989).

Lee, W., W. J. Lackey, and P. K. Agrawal, "Kinetic analysis of chemical vapor deposition of boron nitride," J. Amer. Ceramic Soc. 74, 2642 (1991).

Maya, L., and L. A. Harris, "Pyrolytic deposition of carbon films containing nitrogen and/or boron," J. Amer. Ceramic Soc. 73, 1912 (1990).

Michaelidis, M., and R. Pollard, "Analysis of chemical vapor deposition of boron," J. Electrochem. Soc. 132, 1757 (1985).

Moore, A. W., S. L. Strong, and G. L. Doll, "Properties and characterization of codeposited boron nitride and carbon materials," J. Appl. Phys. 65, 5109 (1989).

Nakamura, K., "Preparation and properties of amorphous boron nitride films by molecular flow chemical vapor deposition," J. Electrochem. Soc. 132, 1757 (1985).

Perkins, F. K., R. A. Rosenberg, and L. Sunwoo, "Synchrotronradiation deposition of boron and boron carbide films from boranes and carboranes: decaborane," J. Appl. Phys. 69,4103 (1991).

(List continued on next page.)

Primary Examiner—Craig E. Church
Attorney, Agent, or Firm—Thorpe, North & Western

[57] ABSTRACT

An optical device for interacting with x-ray radiation, wherein the device includes an optical element configured for use as part of a spectroscopy tube, proportional counter, Geiger counter, optical detector or similar optical instrument. An exposed surface of the optical element is coated with at least one bonded layer of boron hydride composition to protect against abrasion, corrosion and other forms of degradation, as well as to provide enhanced sealing of the Z material against leakage. Methods of bonding the desired coating to the optical element are also disclosed.

32 Claims, 8 Drawing Sheets

OTHER PUBLICATIONS

Shirai, K., S.-I. Gonda, and S. Gonda, "Characterization of hydrogenated amorphous boron films prepared by electron cyclotron resonance plasma chemical vapor deposition method," J. Appl. Phys. 67, 6286 (1990).

Vandenbulcke, L. G., "Theoretical and experimental studies on the chemical vapor deposition of boron carbide," Indust. Eng. Chem. Prod. Res. Dev. 24, 568 (1985).

Winter, J., H. G. Esser, and H. Reimer, "Diborane-free boronization," Fusion Technol. 20, 225 (1991).

Das, D. K., and K. Kumar, "Chemical vapor deposition of boron on a beryllium surface," Thin Solid Films, 83(1), 53–60.

Das, K., and Kumar, K., "Tribological behavior of improved chemically vapor-deposited boron on beryllium," Thin Solid Films, 108(2), 181–188.

NOVEL COATING FOR PREVENTING CORROSION TO BERYLLIUM X-RAY WINDOWS AND METHOD OF PREPARING

BACKGROUND OF THE INVENTION

This invention relates to protective coatings for optical devices consisting of beryllium and other low Z (atomic number) elements for the purpose of enhancement in x-ray applications. More particularly, it pertains to protecting beryllium (or any other low Z element) with a coating having a) good transmission for long wavelength x rays, b) hardness to permit a higher resistance to abrasion, c) the effect of sealing the surface to give a higher resistance to corrosive elements and a surface free of pinholes and other anomalies which may limit its usefulness, and d) the ability to reduce or eliminate secondary emission from the transmissive element. This invention also includes several uses of the coating when applied to beryllium that make possible new and improved optical device x-ray tube and detector designs.

One application of beryllium and other low Z elements has been in connection with optical elements called window structures used for the transmission of radiation, such as x rays, from radiation generation elements. These optical elements are typically embodied in an optical device x-ray tube in which a vacuum environment along with a source of high energy particles, typically electrons, and a target which will generate the desired energy spectrum of x rays, is contained. Such windows typically need to satisfy the difficult requirements of being strong enough to withstand the environmental pressure differences between the inside and the outside of the tube and the chemical environment outside the tube, while being transmissive to the x rays generated by the target. Additionally, the window should not interfere with the prospective applications by creating secondary x rays within the range of energy which is of interest to the user nor should the window degrade over time with the continuously high rate of radiation which it receives.

In a similar application, the source of radiation is an electron microscope where high velocity electrons impinge on the specimen being examined and generate x rays characteristic of the atomic composition of the specimen. The optical device x-ray detector assembly part of an x-ray fluorescent spectrometer is typically placed as close as possible to the specimen. This detector assembly consists of an x-ray transparent port which separates the vacuum in the microscope from the vacuum in the detector assembly, an energy dispersive or wavelength dispersive detector element and the associated electronic connections and heat dissipation elements. This x-ray fluorescent spectrometer is used to analyze the emergent x rays and determine the composition of the specimen.

It is well-known that materials to be analyzed by the technique of x-ray fluorescence are more excited and thus more readily detected when the energy of the exciting radiation is close to the energy at which the material re-emits its characteristic x ray. The desire to detect elements with low atomic numbers has created the need to irradiate the sample with lower energy (longer wavelength) x rays. These are precisely the x rays that are most attenuated by any material. Therefore, a thinner window on an x-ray tube with the same applied rated power (KeV X ma) as presently exists would result in a significantly increased emission of the longer wavelength radiation (assuming an appropriate target which will generate such wavelengths). Such increased emissions would result in the better excitation of the light elements in the sample with a corresponding higher flux of the elemental characteristic radiation. This higher flux would have a greater probability of detection by the appropriate type of detector, resulting in an improved lower limit of detection for the light element sample in the spectrometer.

Thus, both the elements to be detected and the elements used in the transmissive structures are necessarily in the low Z area. Z refers to the atomic number of the element in the periodic chart. Low Z more specifically relates to those elements with an atomic number of less than 15 (hydrogen, helium, lithium, beryllium, boron, carbon, nitrogen, oxygen, fluorine, neon, sodium, magnesium, aluminum, and silicon). Such elements should also be stable for the intended use and may be either single element structures or compound structures consisting of a preponderance of low Z material.

In other x-ray applications, an optical element such as a coated window, even of a beryllium thickness unacceptable for soft x-rays, would still be useful in the harsh environments sometimes found in process control, or where it is desired to water cool the window when the window itself is the x-ray generating anode target or, as in some high power, side window x-ray tubes, the power rating of the tube is limited by the ability of the window to dissipate heat caused by the bombardment of electrons reflected from the tube target.

The conventional technology for optical element x-ray tube windows used in high power, end window or low power, side window x-ray spectrometer tubes for light element applications, utilizes beryllium foil that has been rolled to a typical thickness of 5 mils (127 microns) and then brazed and/or compression bonded to a monel or stainless steel support structure which is or will become part of the tube envelope. This thickness is a compromise between a thicker dimension for providing a strong, sufficiently long lived structure for the high vacuum which exists inside the tube and a thinner dimension so as to permit a maximum amount of long wavelength x rays to escape from the tube. Although attempts have been made to manufacture tubes with thinner optical element windows, these have not been entirely successful because of either low manufacturing yield or unsatisfactory lifetimes for the in-use tube. The main short and long term failure mode for thin window x-ray tubes has been the development of a leak in the Be window resulting in sufficient air entering the tube to produce high voltage breakdown.

The manufacture of the Be foil used in the optical element x-ray tube windows has been accomplished by compressing beryllium powder of approximately 99.5% purity into billets and then rolling the billets until the desired foil thickness is achieved. After rolling, the beryllium grain sizes average 3.5 microns thick and 40 microns wide. The 0.5% contaminants (mostly oxygen) are generally segregated at the grain boundaries.

The vacuum leaks typically follow paths along the grain boundaries. The thinner the window, the shorter the paths and the higher the probability of leaks. Condensation of moisture on the external surface of the optical element x-ray tube window, particularly in the presence of salts whether from the environment or from human contact, contributes to the generation of leaks by electrolytic action between the beryllium grains and the metal window support as well as between the grains and the contaminants at the grain boundaries. The beryllium, which is chemically active, is readily dissolved by the galvanic action of the salt solution creating leaks in initially "vacuum tight" windows.

A prior art approach to resolving this problem has been the coating of the beryllium with another material that will protect the beryllium from exposure to the corrosive effects of moisture and yet will withstand the detrimental effects of high radiation dosage from the tube. Many types of coating have been tried without success, such as diamond and amorphous boron nitride.

A chemically active environment as is required to deposit diamond films can lead to the etching of the beryllium at the same time as the diamond is deposited. This makes the achievement of a thin, pinhole-free film problematic. Diamond is deposited within an environment rich in atomic hydrogen which, in addition to etching the beryllium, can produce volatile and potentially toxic beryllium hydrides. Boron nitride requires deposition at high tensile stress to avoid the creation of pinholes. With high stress, however, the boron nitride is subject to post deposition delamination.

OBJECTS AND SUMMARY OF THE INVENTION

It is the object of the invention to provide a material to be used as a coating for optical elements consisting of beryllium (or other low Z material) which will render the optical elements impervious to the effects of corrosion and chemical attack without compromising their x-ray transmission function.

It is another object of the invention to provide a coating for beryllium (or other low Z elements) optical elements which will render the elements relatively impervious to the effects of abrasion.

It is another object of the invention to provide a surface coating which will seal surface pinholes and other anomalies and permit a more vacuum tight surface.

It is another object of the invention to permit the manufacture of an optical element x-ray window in a configuration which will enhance the transmission of a greater amount of long wavelength, "soft" x rays.

These and other objects are realized in a method and device relating to the bonding of a thin layer of boron hydride composition on an exposed surface of an optical element comprised of low Z material. This coating provides protection against abrasion and leakage of the operable Z material, but does not interfere with interactions with x-ray radiation. Variations of this coating are disclosed within an assortment of optical devices. A preferred method of manufacture is also disclosed.

BRIEF DESCRIPTION OF THE DRAWINGS

The above and other objects, features and advantages of the invention will become apparent from a consideration of the following detailed description presented in connection with the accompanying drawings in which.

DETAILED DESCRIPTION

This invention relates to a method of treating beryllium (or any other low Z materials) which are typically used in optical elements and optical devices, by coating the beryllium with a thin layer of amorphous boron hydride a-B:H or a thin layer of amorphous boron hydride alloy (a-B:X:H), where X represents the option of adding another low Z element. A layer is defined as a film or coating that is bonded through physical or chemical means to the surface of the object to be coated. This has the effect of greatly increasing the performance of the beryllium/low Z and boron hydride combination as compared to existing beryllium/low Z structures when used in x-ray applications. The performance increase results from a combination of (i) vacuum sealing the beryllium/low Z material, particularly when used in foil form, (ii) protecting the beryllium/low Z material from environmental (chemical and abrasion) damage, and (iii) making beryllium/low Z material to metal braze joints corrosion-resistant. For instance, these advantages allow the use of thinner beryllium foil in x-ray window optical element applications that is allowed by the current state of the art, and also permits existing beryllium structures to be used in new applications where the abrasion rate would be unacceptable if left uncoated.

X-ray fluorescence spectrometers use x rays from an optical device called an x-ray tube to excite characteristic radiation in a sample. An important parameter is the efficacy of the radiation emitted from the x-ray tube in exciting characteristic radiation in the sample. In general, characteristic x rays are more efficiently excited by incident radiation which is close to (but greater than) their own energies. If the incident radiation is much higher in energy than the excited characteristic radiation, the characteristic radiation is only weakly excited.

X-ray detector optical devices depend on optical elements called windows which will allow x rays to pass into the detector, but which also will maintain a seal against gas passing into or out of the detector. State-of-the-art optical element beryllium window detectors cannot see elements lighter than sodium. This is due to the thickness of beryllium necessary to form a vacuum-tight detector. Both of these problems cause existing spectrometers to be limited in their effectiveness for elements lighter than sulfur.

Embodiment 1

Figure 1:
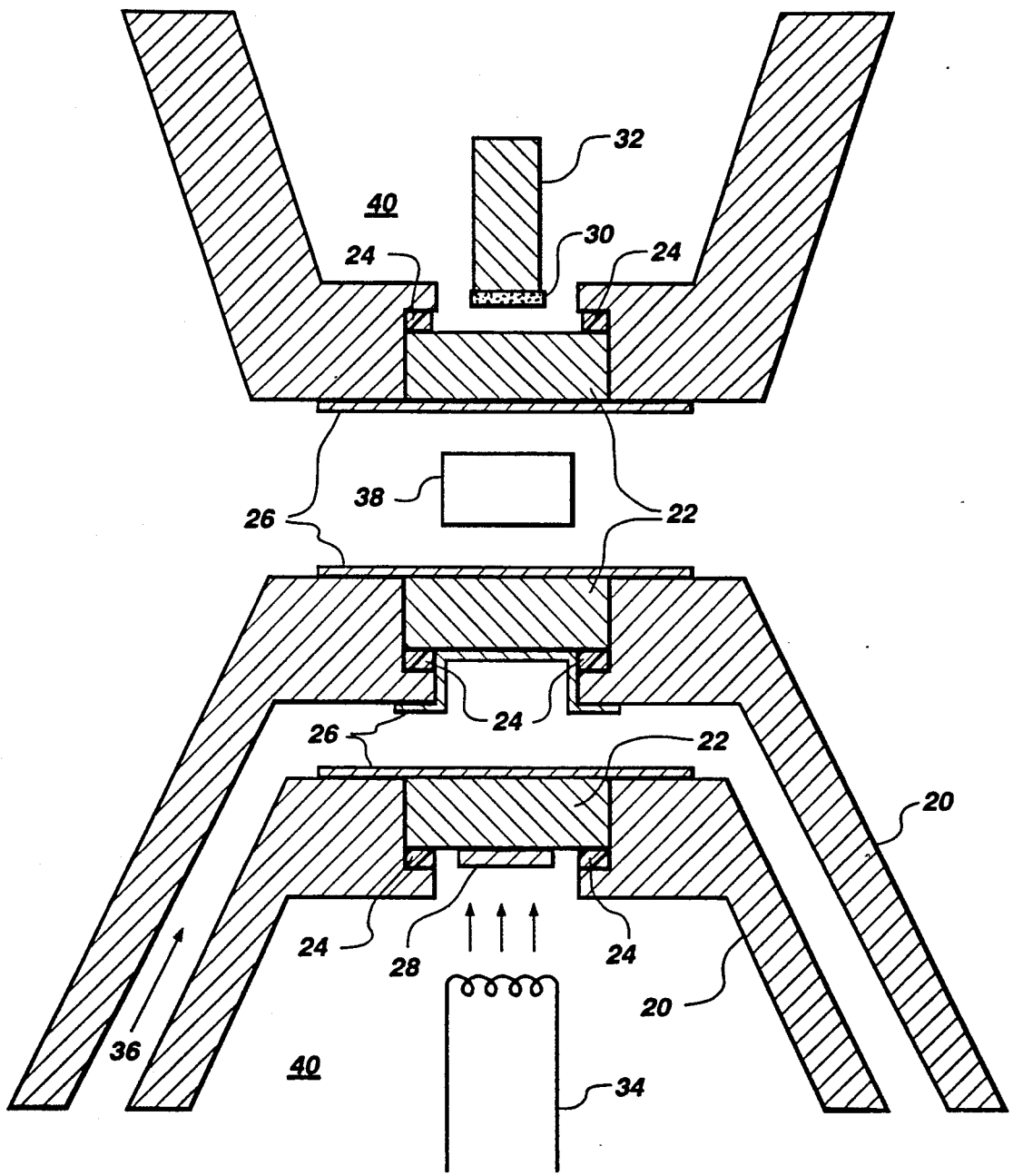
FIG. 1 graphically shows a water cooled, transmission target x-ray source optical device, a solid state detector optical device and sample to be analyzed in a schematic cross section. The source and the detector may or may not be in line with each other and a vacuum may or may not exist about the sample.

One embodiment of the invention is contained in FIG. 1 in which two optical devices, an x-ray tube and detector structure, are shown. In specific cases, portions of the assembly may be modified, replaced or dispensed with. These optical devices are used in an x-ray fluorescence spectrometer. A metallic body 20 is created such that the flow of coolant is contained in its channel 36. Beryllium foil 22 is then brazed to the optical element structures 24. The appropriate exposed surface of the beryllium is coated with a thin film of boron hydride compound a:B:X:H 26. An appropriate x-ray generation material (such as rhodium) is deposited on the tube side of the beryllium 28. The cathode of the tube 34 contained within the tube's inner volume is surrounded with a vacuum 40. The optical device energy dispersive detector 30 is mounted on a copper cold finger structure 32 to permit its operation at very low temperatures and is surrounded with a vacuum 40. The sample 38 is shown between the source and the detector such that the incident source x rays will strike the sample which will then reemit characteristic elemental x rays which are then detected by the energy dispersive detector and identified.

The tube and the detector may or may not be in alignment. The x-ray source optical device side of the structure may also be similar to that in FIGS. 3 and 4. In these instances, the cooling and cathode/anode assemblies are significantly different than in FIG. 1. The x-ray detector optical device side of the structure may also be similar to FIG. 7. The coating 26 on the beryllium enhances the operation of the optical device by permitting the beryllium window optical element to be made only as thick as required to support the pressure differentials involved. The coating 26 protects the beryllium from the effects of the coolant whether they be benign, corrosive, or abrasive and the effects of the atmosphere or the corrosive and/or abrasive effects of the sample material in the sample chamber. In order to validate the resistance to corrosion and abrasion, tests were performed to determine the ability of the material to withstand known reagents. A hardness test was performed by Lawrence Livermore Laboratories. They reported that the hardness of the boron hydride coating was 2500 to 3000 Vickers. This hardness should withstand abrasive slurries for a considerable period of time.

The samples for the etching study were prepared by depositing boron hydride composition on silicon substrates using 3-inch silicon wafers. The structure of the CVD system used is graphically shown in FIG. 10. The furnace 150 used is a three-zone, CVD system of 90 inches in length. The temperature is controlled with the use of tristage controller 162. The quartz tube 152 inside the furnace is 102 mm in diameter. The gas source 154 used was diborane ($B_2H_6$) in 14.9% ±2% argon. In general, the composition could run as high as 100% diborane. The location of the silicon wafer sample to be coated 156 was 2.5 plus or minus 0.5 inch from the entrance to the first zone of the furnace. The mass flow controller 158 was set to a voltage of 1.25 which delivered a flow rate of approximately 50 standard cc's/minute of diborane into the furnace. The furnace 150 temperature was adjusted to a nominal temperature of 450° C. The deposition time for the gas composition and flow rate of the preferred embodiment was 30 minutes. A pump 160 was used to achieve a before deposition pressure inside the quartz tube of <50 microns as measured by the pressure gauge 164.

Figure 10:
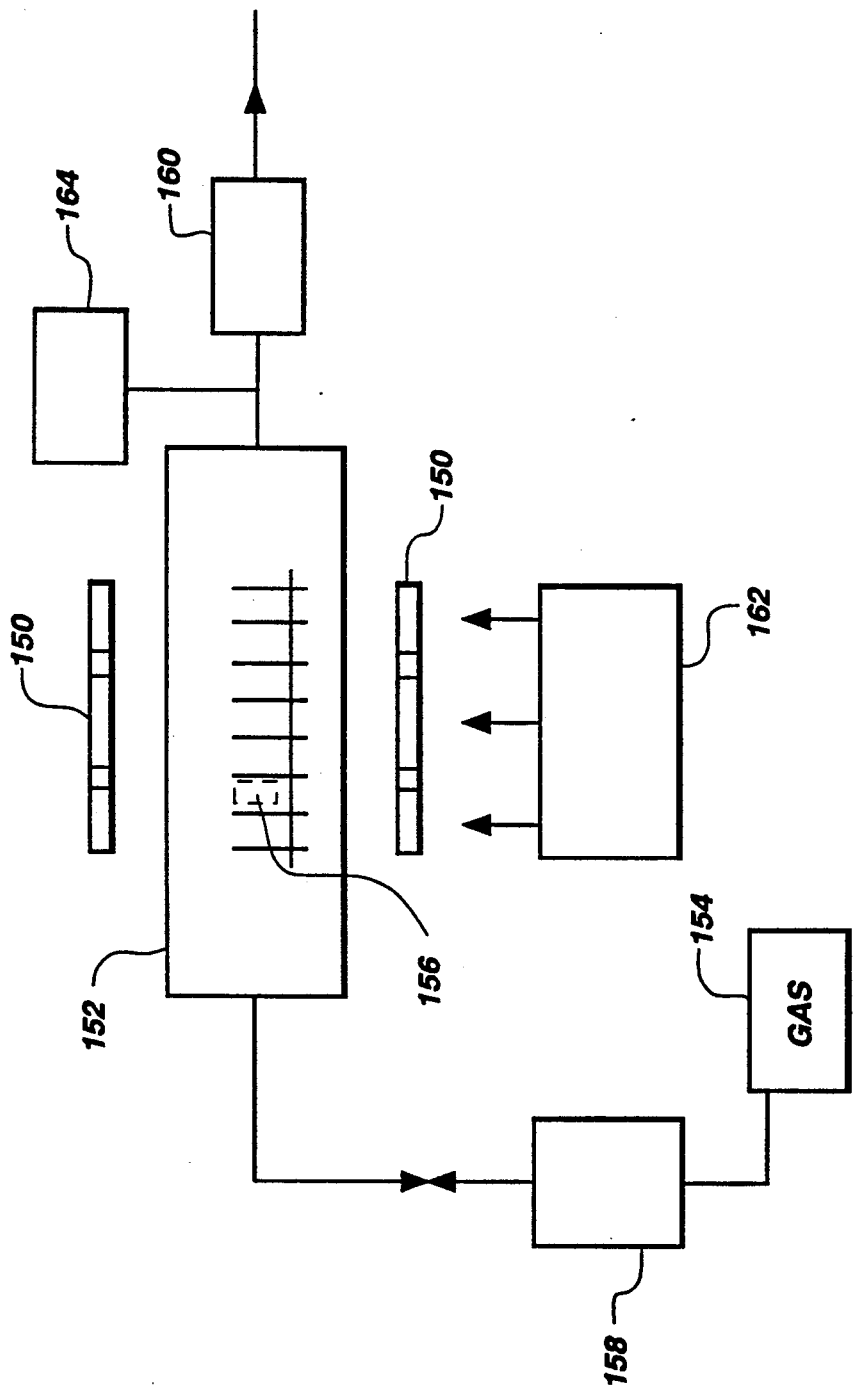
FIG. 10 schematically describes a hot wall CVD system used in the deposition of a:B:X:H.
Figure 11:
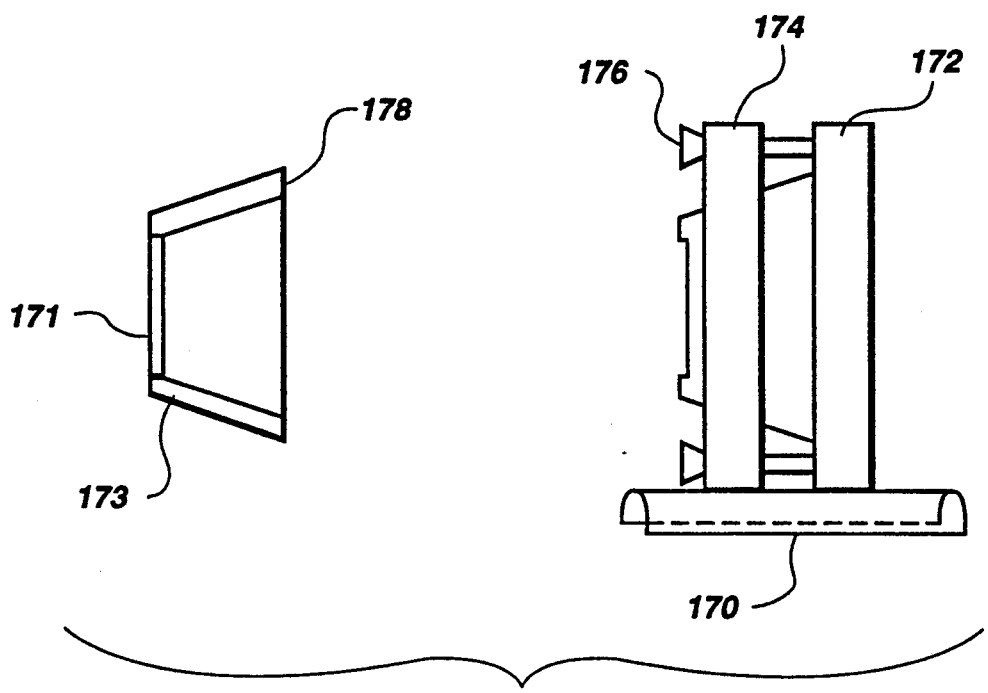
FIG. 11 schematically describes a specialized sample holder for use in the CVD system.

When the sample is to be coated on all surfaces, a simple holding mechanism which permits gas access to all surfaces is used. If the sample is only to have the coating upon selected surfaces, then the special holder shown in FIG. 11 is used. The sample to be coated 178 which consists of a beryllium window 171 and a metallic housing 173 is placed between the back of the holder 172 and the adjustable restraining ring 174. The ring is made specifically for each sample to be coated such that the center opening is of the exact size necessary to create the desirable coated area. The back is mounted into a base unit 170 which holds it in the vertical position. The restraining screws 176 are then tightened to securely hold the sample in place. The openings between the restraining ring 174 and the back of the holder 172, if any, are covered with tape or other material such that the gas will not penetrate to the sample surface. This assembly 156, containing the sample, is then placed in the CVD system as shown in FIG. 10, and a coating of boron hydride composition is bonded on the sample.

The coated samples prepared using the techniques in the first embodiment were then tested for their susceptibility to corrosive reagents. Beryllium is an active metal usually passivated by its native oxide. It can be stable in basic solutions for short periods of time. There were two procedures used for the measurement of the etching rate: the optical method and the stylus method. For the optical method, a Perkin Elmer 320 was used to measure the exact position of the interference fringes of a boron hydride composition deposited on a silicon wafer. It is well-known that for the two adjacent maxima of the fringes the following simultaneous equations exist:

$$2nd \cos \alpha = m_1 \lambda_1$$
$$2nd \cos \alpha = m_2 \lambda_2, \quad (1.1)$$

where $m_1$, $m_2$ are consecutive integers, $m_2 = m_1 - 1$, and n is the optical index of the thin coating on the silicon wafer, d is the coating thickness, $\lambda$ is the incident wavelength, and $\alpha$ is the incident angle of light on the sample. The optical index is such that n does not vary with the wavelength. Indeed, for $\lambda_1$ close to $\lambda_2$, n will not change much even for dispersive materials and the assumption that n is effectively constant is reasonable. The following relationship holds:

$$m_1 = \frac{\lambda_1}{\lambda_2 - \lambda_2} \quad (1.2)$$

Substituting (1.2) into any one of the simultaneous equations (1.1), we could find the optical thickness. Since n was known for certain wavelengths, it was possible to determine the coating's thickness, d.

If the etching rate were constant, then only the initial and final thicknesses and the etching time would need to be known to determine the etching rate. However, one could not conclude that the etching rate is constant and therefore measurements must be made at many intermediate steps.

For samples with high etch rates, a stylus method was used to measure the change in thickness. Several strips of chemically resistive tape were placed upon the boron hydride composition coated surface of the silicon wafer, each one partially overlapped by another. During etching the sample would periodically be taken out of the etching bath, and one strip of the chemically restive tape would be removed so that another step would be exposed. The sample would then be returned to the reagent solution. We then found the etching rate at several intermediate times by using the stylus method to measure the heights of the steps. This method does not limit the original thickness of the boron hydride composition coating, so that thick coatings could be made upon silicon wafers for the test. Since the scan range of the stylus instrument was more than 100 $\mu$m, the slope of the step caused by the etching under the tape did not influence the measurement of its height.

Using the above routine, the thickness of the boron hydride composition coating was measured after each etching and the etching rate was determined. Table 1 indicates the etching rate of boron hydride composition coating for various reagents.

TABLE 1

Etching Rate of a:B:H Coatings

| Etching Reagents+ | pH | Etch Rates (nm/min @ 25° C.) |
| --- | --- | --- |
| HF | 0.8 | negligible |
| $H_2SO_4$ | −1.38 | negligible |
| $HNO_3$ | −1.17 | 1.09 |
| Acetic Acid | 1.8 | negligible |
| $H_3PO_4$ | −1.17 | 0.146 |
| Aqua Regia++ | −1.0 | 0.14 ± 0.02 |
| $NH_4OH + H_2O_2$ | 11.4 | negligible |
| NaOH Solution* | 13.7 | negligible |
| Ferricyanide** | 13.7 | 165 |
| Permanganate# | 13.7 | 900 |

+All solutions are concentrated unless otherwise indicated.
++Solution is 1 M $HN_3$, 3 M HCL, 1 M $H_2O$
*Solution is 0.5 M NaOH, 0.6 M $H_2O_2$
**Solution is 0.6 M $K_3Fe(CN)_6$, 0.5 M NaOH, 0.02 M oxalation
Solution is less than 0.6 M $KMnO_4$, 0.5 M KOH Upon examination of the table, it is clear that the boron hydride composition coatings are very stable in bases and concentrated non-oxidizing acids such as concentrated HF, HCL, $H_3PO_4$, $H_2SO_4$, and glacial acetic acid. The etch rate in oxidizing acids, such as concentrated nitric acid and aqua regia, is measurable-about 3 $\mu$m/day. The etch rate in oxidizing bases such as permanganate and ferricyanide is high, approaching 1 $\mu$m/min (the contents of the solutions are listed above).

Embodiment 2

It was desirable to test the boron hydride composition coating upon a low Z material of choice, such as beryllium. A beryllium sample of approximately 4 mils thick was first cleaned according to the following procedure: the sample was immersed in methanol for 2-3 minutes and then dried using pure nitrogen gas. Referring to FIG. 10, the conditions for deposition were as follows. The beryllium sample to be coated on both sides was placed 2.5 inches from the entrance to the first zone of the furnace. The mass flow controller was adjusted to a voltage of 1.25 which delivered a flow rate of 50 standard cc's/minute of diborane into the chamber and the furnace was adjusted to a nominal temperature of 450° C. The deposition time was 40 to 60 minutes. Before deposition the pressure inside the quartz tube was <50 microns.

The severest test possible was then made of the treated material in that 17 milliliters of hydrofluoric acid of approximately 48% concentration was diluted to 40 milliliters of solution and then applied to the coated sample. No etching or pinhole corrosion was observed in the treated sample whereas uncoated beryllium completely dissolved within 5 minutes. This shows that the beryllium is now relatively impervious to the effects of some quite strong reagents thus permitting the beryllium to be made significantly thinner than would otherwise be feasible. The decreased thickness of the window device permits a greater amount of soft x rays to strike the sample, thus creating a higher flux of elemental emission which, again because of the thinner beryllium window device on the detector side, enables greater transmission through the detector window device and a larger signal for analytical purposes. Tests were performed to verify the additional transmissivity of the boron hydride composition coated but much thinner beryllium.

Embodiment 3

Samples of 1 mil and 5 mil beryllium were obtained from Electrofusion, Inc., a commercial supplier of such material. The 1 mil sample was separated into two pieces such that one would remain uncoated and the other could be coated using the system as shown in FIGS. 10 and 11. The location of the sample in the CVD system was 3 inches from the entrance of the first hot zone. The deposition time was 60 minutes. The mass flow controller was adjusted to a voltage of 1.25 which delivered 50 standard cc's/minute of diborane into the chamber and the furnace was adjusted to a nominal temperature of 450° C. Before deposition the pressure inside the quartz tube was <50 microns. The resultant one sided boron hydride composition coated beryllium was then included with the uncoated 1 mil and 5 mil foil. Each foil was placed in a Rigaku Spectrometer in front of the proportional counter window. The foils entirely covered the window. The appropriate sample was placed in the chamber in order to generate the necessary elemental radiation. Since the sample holder can contain more than one sample, all of the necessary element samples were placed in the sample holder. The system was first run without the foils present so that a baseline transmission value could be established. Each foil to be tested was then inserted into the chamber and secured to the proportional counter. The same elemental samples were then rotated through the sample chamber and measurement of the signal strength was achieved. The results of these tests are contained in Table 2.

TABLE 2

Percent Transmission for Coated and Uncoated Beryllium

| Element | Wavelength (Angstroms) | 1 mil Be Uncoated | 1 mil Be Coated | 5 mil Be Uncoated |
| --- | --- | --- | --- | --- |
| Oxygen | 23.71 | 0.0% | 0.0% | 0.0% |
| Fluorine | 18.31 | 0.0% | 0.0% | 0.0% |
| Sodium | 11.91 | 7.0% | 5.1% | 0.2% |
| Magnesium | 9.889 | 22.8% | 17.8% | 0.5% |
| Aluminum | 8.338 | 60.5% | 54.0% | 2.2% |

TABLE 2-continued

Percent Transmission for Coated and Uncoated Beryllium

| Element | Wavelength (Angstroms) | 1 mil Be Uncoated | 1 mil Be Coated | 5 mil Be Uncoated |
|---|---|---|---|---|
| Silicon | 7.126 | 77.6% | 72.9% | 12.4% |
| Sulfur | 5.373 | 78.0% | 79.7% | 39.4% |

Measurement error ± 2%

This marked improvement in the output of longer wavelength x rays enhances the ability to analyze light elements.

Embodiment 4

Tests were conducted which showed that the boron hydride composition coating had the effect of sealing pinhole leaks which are often existent in such thin foils. Three assemblies consisting of 1 mil beryllium windows brazed into stainless steel mounts similar to those used for the optical element end caps of end window x-ray tubes were purchased from Electrofusion. These assemblies were first leak tested to verify the results of leak testing performed by the manufacturer. The system used to perform the CVD is shown in FIG. 11. The location of the window assembly was 2 inches from the entrance of the first zone. The mass flow controller was adjusted for voltage of 1.25 in order to deliver 50 standard cc's/minute into the chamber and the furnace was adjusted to a nominal temperature of 450° C. Before deposition the pressure inside the quartz tube was <50 microns. The coating was on one side of the 1 ml beryllium window flange and extended over the stainless steel holder so that the brazed connection was entirely contained beneath the coating. Three layers of boron hydride were deposited. The duration time for each layer was 15 minutes.

The coated assemblies were then tested for leaks using a test stand which consisted of an Alcatel model ASM 110 helium leak detector and special fixture to fit the window assembly. Each window assembly was placed upon the tester, a vacuum drawn below the window and helium was introduced in low concentrations above the window. This test was repeated immediately after the boron hydride composition coating was performed and then again after a 7 month period in which the window assemblies were stored in plastic containers in a normal room environment. The results of the tests performed are contained in Table 3.

TABLE 3

Leak Rate Analysis

| | Sample Number | | |
|---|---|---|---|
| | One | Two | Three |
| Initial Leak Rate | $1.1 \times 10^{-7}$ | $6 \times 10^{-7}$ | $1 \times 10^{-10}$ |
| Coated Leak Rate | $1 \times 10^{-10}$ | $1 \times 10^{-10}$ | $1 \times 10^{-10}$ |
| Current Leak Rate | $1 \times 10^{-10}$ | $1 \times 10^{-10}$ | $1 \times 10^{-10}$ |

Figure 2:
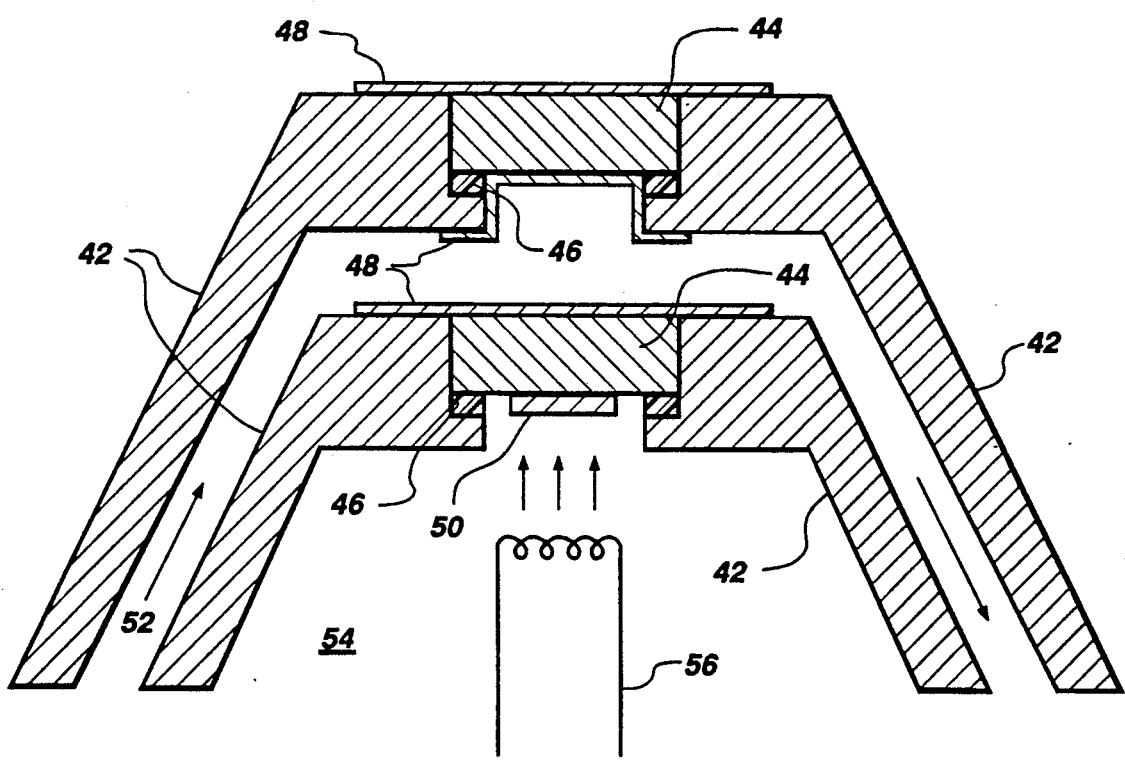
FIG. 2 shows an end window, water cooled, transmission target x-ray tube optical device assembly in graphic cross section.

FIG. 2 depicts another embodiment of the invention in which an x-ray source optical device in which a water cooled window is used in a transmission target, end window configuration. In this embodiment, the tube body 42 contains the water channel 52 between two windows of beryllium foil 44. The two windows are each brazed into their respective apertures 46 and then the coolant side of the inner window and both sides of the outer window are coated with the boron hydride composition coating 48. The inner surface of the inner window is deposited with a coating of rhodium 50 or other x-ray generating material which is bombarded with electrons from the cathode 56. This inner volume of the structure must be under a high vacuum 54. The window thickness of this structure is even more critical to the ability of the tube to provide large quantities of the softer x ray since three window optical elements are involved. The differential pressure between the outside atmosphere of the tube and the increased pressure of the coolant flow as compared to the high vacuum required within the inner volume to eliminate arcing between the anode and the cathode determine the necessary optical element window thicknesses. The typical thickness is up to 5 times greater than those actually required in order to mitigate the effects of corrosion, both within the exposure areas and at the boundaries of the window, as well as the effects of pinhole leaks.

Embodiment 6

Figure 3:
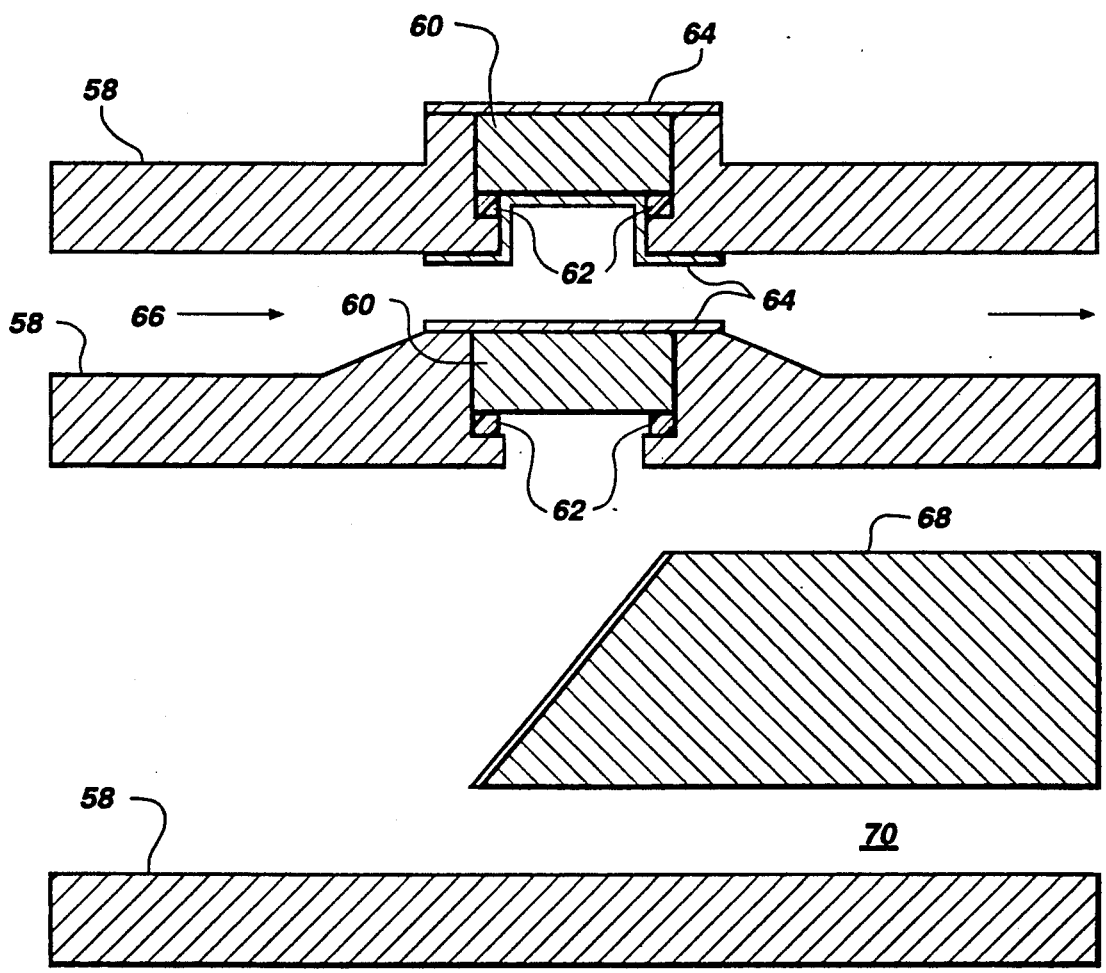
FIG. 3 illustrates a graphic cross section of a side window, water cooled x-ray tube optical device assembly.

FIG. 3 depicts a side window, water cooled x-ray source optical device consisting of a tube body 58 with two beryllium window optical elements 60 brazed to the window apertures 62 in the tube body 58. A cooling water channel 66 is provided to protect the beryllium windows from becoming overheated and causing a failure. The beryllium windows 60 are coated on both inner sides and the external tube side with a thin coating of boron hydride composition or amorphous boron hydride alloy 64. This coating has the effect of protecting the exposed surfaces from the potentially corrosive effects of the coolant and the atmosphere and provides the benefits as specified in FIG. 1. The tube anode 68 is bombarded with electrons creating the x rays which then escape through the beryllium window optical elements 60. Again, the inner volume of the tube is held to a very high vacuum 70.

Embodiment 7

Figure 4:
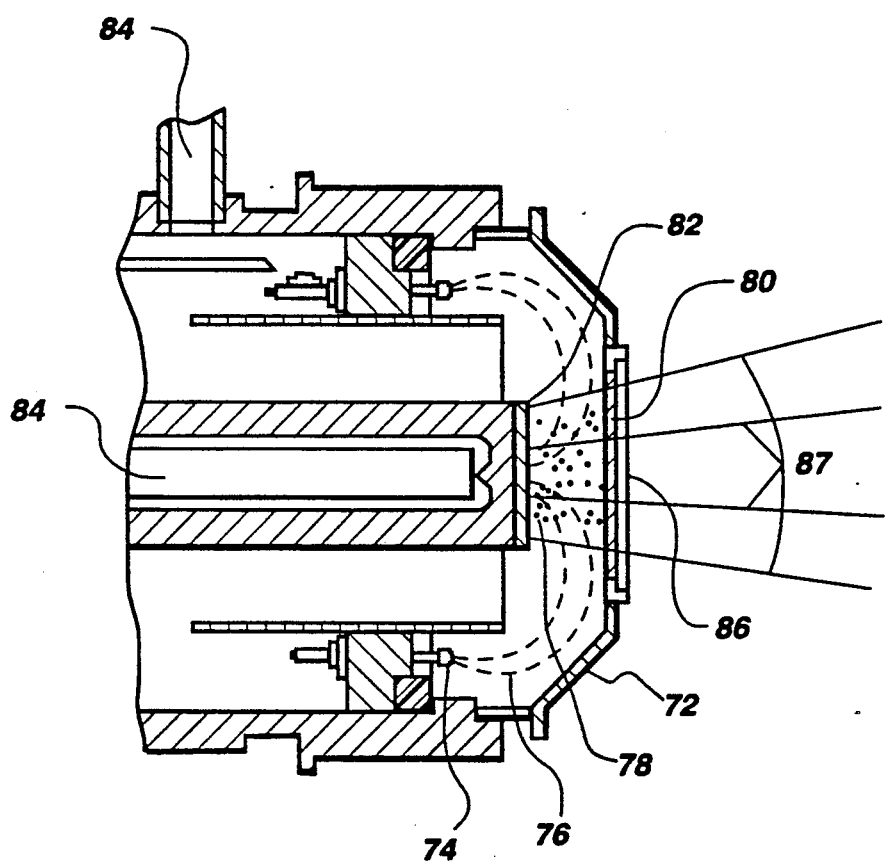
FIG. 4 shows a cross sectional view of an end window, high power, x-ray tube optical device of the type typically used for x-ray spectroscopy.

FIG. 4 depicts a typical high power end window x-ray source optical device. The tube body and window mount assembly 72 are held at ground potential so as to minimize the potential that secondary electrons will impinge upon the window optical element. A beryllium window optical element 80 is brazed to the window mount assembly 72. The mount and window are then coated with a thin coating of boron hydride composition or amorphous boron hydride alloy 86. This coating protects the window from the effects of exposure to the atmosphere and to handling. It also seals the small pinholes which may develop into leaks in the future and removes the potential for the dissimilar metals at the brazed junction to decompose the beryllium and create window leaks over time. The beryllium can therefore be reduced from the typical 5 mil thickness to a 1 mil thickness which will greatly improve the emission of soft x rays. The filament 74 creates a primary electron beam 76 which due to the electrical potential difference between the filament 74 and the target 82 strikes the target 82 and generates the x rays 87. A cooling water channel 84 keeps the target and tube within acceptable operating parameters with regard to heat.

Embodiment 8

Figure 5:
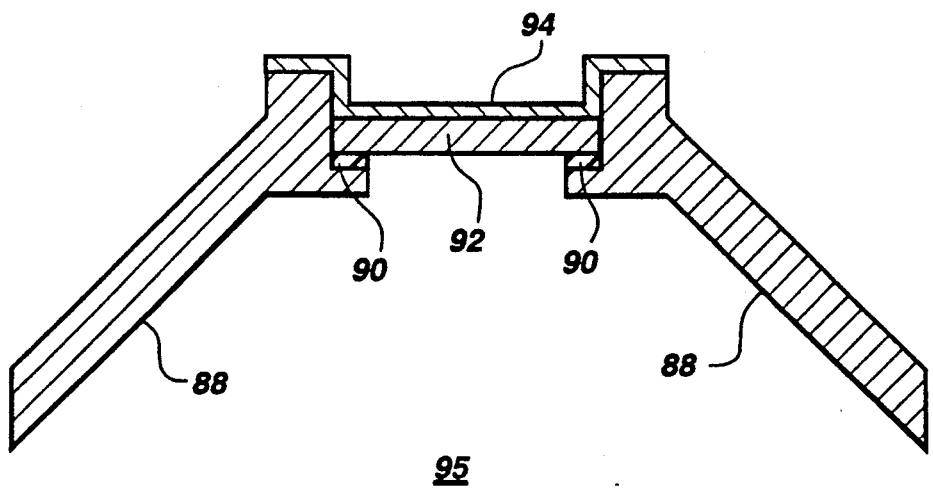
FIG. 5 shows an expanded cross sectional view of a coated Be window optical element mounted on a tube or detector body.

Another embodiment of the invention is shown in FIG. 5. In this embodiment, a general optical element window structure is shown in which the beryllium window 92 is shown brazed or compression bonded 90 to the body 88 of the tube or detector. A thin coating of boron hydride composition or amorphous boron hydride alloy 94 is located so as to passivate the entire surface of the beryllium foil 92 as well as the brazed or compression bonded area 90 and part of the tube body 88. The inner volume of the tube or detector optical device assembly 95 is typically under a high vacuum and therefore does not require protection. The coating protects the outer surface of the window assembly and permits the use of a much thinner beryllium foil without fear of pinhole leaks, corrosion/abrasion, or a gradual degradation of the window due to the dissimilar metals junction.

Embodiment 9

Figure 6:
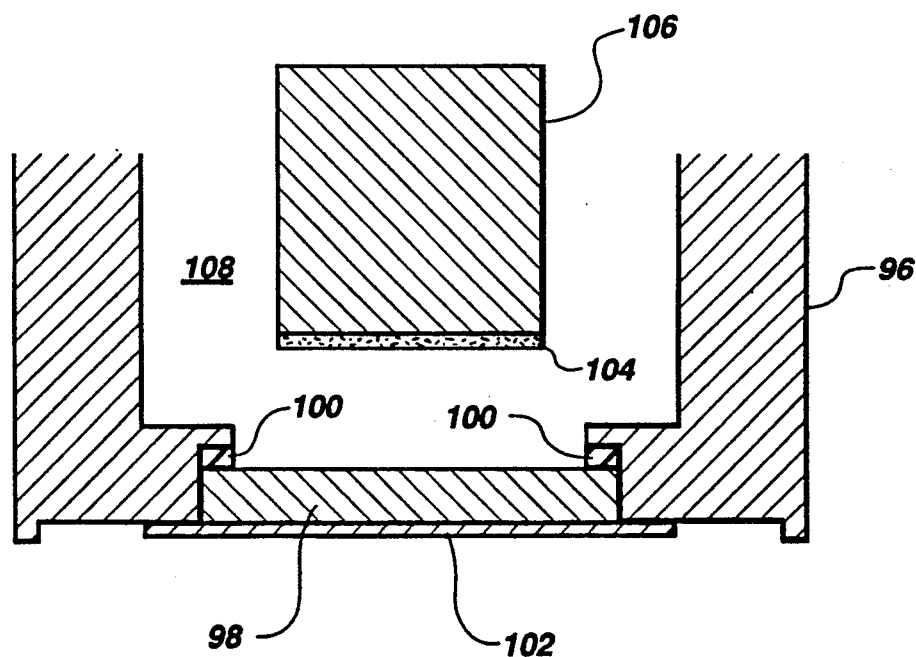
FIG. 6 shows a graphic cross section of a typical energy dispersive detector optical device configuration with a coated window.

Another embodiment of the invention is shown in FIG. 6. In this embodiment, a typical Si(Li) detector window assembly optical device is shown in which the beryllium foil 98 is compression bonded or brazed 100 into the detector body 96. The boron hydride composition or amorphous boron hydride alloy coating 102 covers the entire surface of the beryllium 98 and the juncture between the beryllium and the detector body and part of the detector body itself. The Si(Li) detector material 104 is mounted on the end of a cold finger of copper 106 and a high vacuum 108 is present in the inner volume between the detector/cold finger and the body of the detector. The boron hydride composition or amorphous boron hydride alloy coating protects the outer surface of the Si(Li) detector assembly and permits the use of a much thinner beryllium foil without fear of pinhole leaks, corrosion/abrasion, or a gradual degradation of the window due to the dissimilar metals junction.

Embodiment 10

Figure 7:
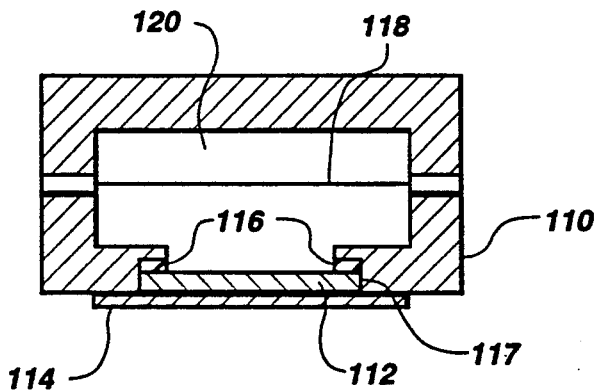
FIG. 7 illustrates a cross section of a typical proportional counter/geiger counter detector optical device assembly with a coated window.

Another embodiment of the invention is shown in FIG. 7. In this embodiment a proportional counter assembly optical device is shown in which the beryllium foil 112 is brazed or compression bonded 116 into a detector body 110. The boron hydride composition or amorphous boron hydride alloy coating 114 is coated over the beryllium foil 112, the junction 117 between the foil 112 and the detector body 110 and extends onto the body 110 itself. The interior of the detector is filled with a gas 120 which either flows through the detector at a prescribed rate or is placed in the detector cavity and then sealed. The detector wire 118 extends through the middle of the cavity. The boron hydride composition or amorphous boron hydride alloy coating protects the outer surface of the proportional counter detector assembly and permits the use of a much thinner beryllium foil without fear of pinhole leaks, corrosion/abrasion, or a gradual degradation of the window due to the dissimilar metals junction.

Embodiment 11

Figure 12:
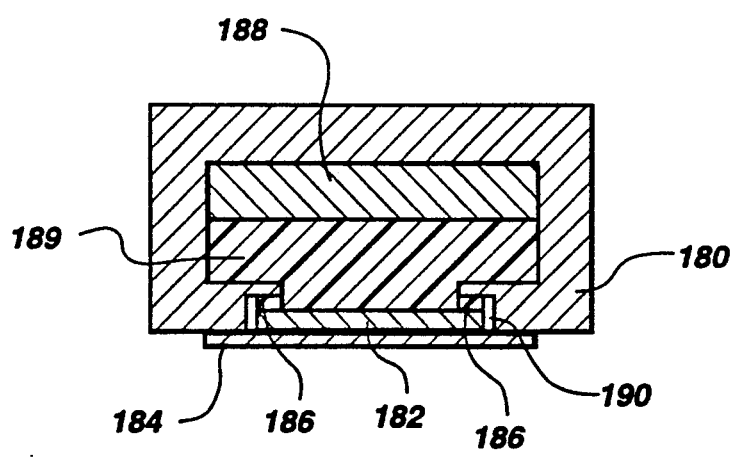
FIG. 12 shows a graphical description of a typical scintillation detector optical device assembly with a coated window.

Another embodiment of the invention is shown in FIG. 12. In this embodiment a scintillation detector assembly optical device is shown in which the beryllium foil 182 is brazed or compression bonded 186 into a detector body 180. The boron hydride composition or amorphous boron hydride alloy coating 184 is coated over the beryllium foil 182, the junction 190 between the foil 182 and the detector body 180 and extends onto the body 180 itself. The interior of the detector is filled with a gas, crystal or plastic material 189 with a photomultiplier assembly 188. The coating protects the outer surface of the scintillator detector assembly and permits the use of a much thinner low Z foil without fear of pinhole leaks, corrosion/abrasion, or a gradual degradation of the window due to the dissimilar metals junction.

Embodiment 12

Figure 8:
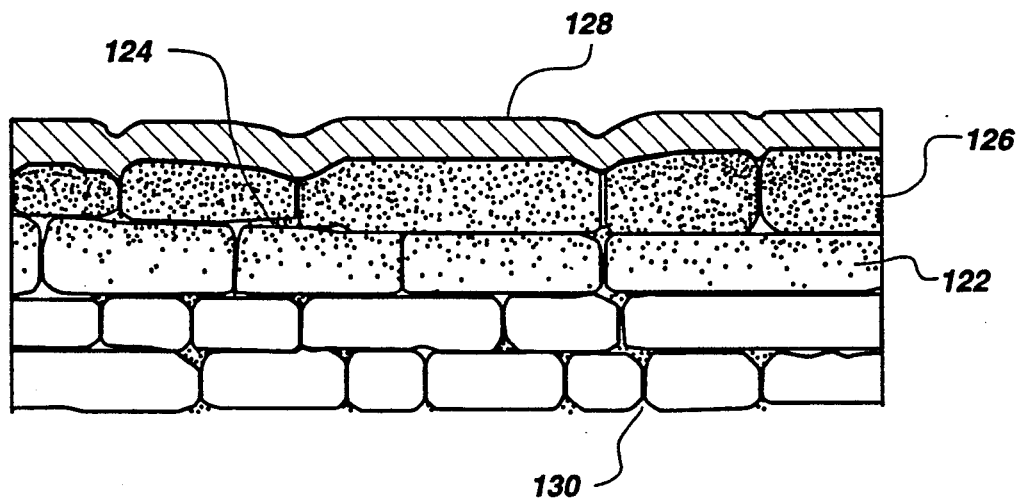
FIG. 8 shows an expanded graphic cross section of an a:B:X:H coated beryllium foil with an inter-diffusion layer.

Another embodiment of the invention is shown in FIG. 8. In this embodiment a cross section of beryllium foil is shown in which the foil grains 122 have boundary contaminants 124. A pinhole leak 130 is shown where the grain boundaries have sufficient contaminants to permit the passage of gas. An inter-diffusion layer 126 is shown just beneath the boron hydride composition or amorphous boron hydride alloy coating 128. The inter-diffusion layer 126 may or may not be present depending upon the process parameters and the type of deposition used. The coating protects the outer surface of the beryllium foil and permits the use of a much thinner beryllium foil without fear of pinhole leaks or corrosion/abrasion.

Embodiment 13

Figure 9:
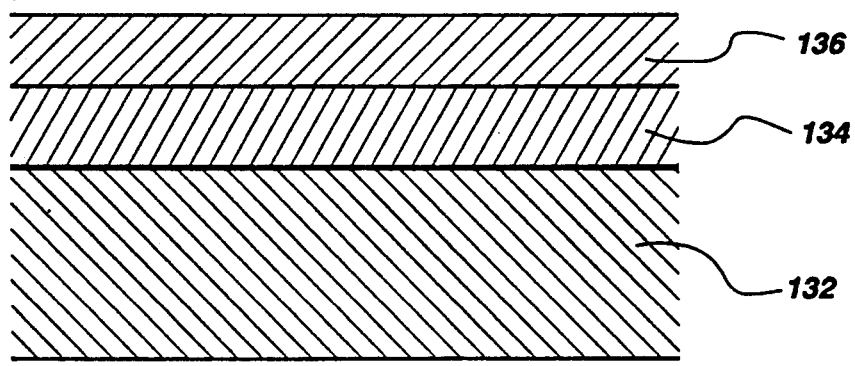
FIG. 9 graphically describes a structure of beryllium with an inter-diffusion layer and an a:B:X:H coating.

Another embodiment of the invention is shown in FIG. 9. In this embodiment a cross section of low Z material such as beryllium is shown in which the low Z material 132 is coated with boron hydride composition or amorphous boron hydride alloy 136. An inter-diffusion layer 134 may or may not be present depending upon the parameters used in the deposition and the method of deposition used. The coating protects the outer surface of the low Z material and permits the use of a selected low Z material without significant concerns regarding corrosion or abrasion. If used in thin structures for leak tight applications, the low Z material will also be more resistant to degradation due to dissimilar metal reactions and to leaks.

Embodiment 14

Another embodiment of the invention involves the coating of amorphous boron hydride alloys by use of a cold wall, high temperature CVD process. A sample to be coated was placed in a cold wall CVD system. The sample temperature was 500 degrees centigrade. The pressure reading before the deposition was 0.09 torr and the deposition continued for a period of 20 minutes. The diborane was introduced into the chamber in approximately the same concentrations as in the hot wall system. An amorphous boron hydride alloy was deposited on the sample which made it black in appearance.

Embodiment 15

Another embodiment of the invention involves the coating of boron hydride carbide (a:B:C:H) by use of the system shown in FIG. 10. A sample to be coated was placed in the CVD system in which a combination gas of diborane and acetylene was introduced. The temperature was set to 450 degrees centigrade. The mass flow setting for diborane was 0.62 volt which delivered 24.8 standard cc's/minute of diborane into the chamber and the setting for acetylene was 2.45 volts which delivered 24.5 standard cc's/minute of acetylene. The deposition continued for a total time of 60 minutes. The sample was coated with a very black material which upon initial study was determined to be boron carbide. This material would be very hard and equally resistant to the effects of reagents and abrasion. Its mechanical characteristics are similar to boron hydride composition. Chemical tests indicate that for certain reagents the carbon containing alloys are more resistive than a:B:H.

Embodiment 16

Another embodiment of the invention involves the coating of polymer with a protective coating. In this embodiment, a piece of polymer, for example: polyimide, silicon based polymers or carbon based polymers, is substituted for the beryllium in that a sample of polymer would be coated with boron hydride composition using the system as shown in FIGS. 10 and 11. The location of the sample in the CVD system was 3 inches from the entrance of the first hot zone. The deposition time was 60 minutes. The mass flow controller was adjusted to a voltage of 1.25 which delivered 50 standard cc's/minute of diborane into the chamber and the furnace was adjusted to a nominal temperature of 450° C. Before deposition the pressure inside the quartz tube was <50 microns. The sample of polymer appeared to have been coated with the identical coating which appeared upon the beryllium without significant damage to the polymer sample. Since polymers often come in films, it is also possible to provide the coating method in a reel to reel technique used to coat such films.

As described above, the thickness of the subject low Z material combined with the thickness of the prospective coating is of vital importance to the intended use. Generally, the thickness of the overall combination of low Z material and coating, given their respective absorptive properties, determines the amount of incident radiation of each wavelength which will be transmitted. It is therefore necessary to determine the balance between the differential pressure which may be encountered in making the necessary measurement and the wavelength of the radiation of interest. This combination will determine the optimum thickness for the combination of material and coating. In cases where the subject low Z material strength exceeds the necessary value to meet the pressure differentials required, a thinner low Z material layer combined with a thicker coating of boron hydride composition may provide for additional wear resistance. In cases where the low Z material is too weak for the differential pressure required, a combination of the low Z material with the coating may provide the additional strength. In cases where the low Z material thickness or type is such that it cannot be made free from leaks, the addition of a thin coating may provide the necessary leak protection while not significantly adding to the lowering of transmission at the wavelength of interest. Although a single coating of 5000 angstroms in thickness has sufficient properties to meet almost all "in use" needs, three or more coating thicknesses are the most desirable.

It will be appreciated by those skilled in the art that the foregoing embodiments are merely exemplary of the inventive principles representative of the present invention. Accordingly, the use of such examples and specific structure and methodology is not to be considered as limiting, except as set forth in the following claims.

We claim:

1. An optical device for interacting with x-ray radiation, comprising:
   an optical element configured for interaction with x-ray radiation as part of an optical device, said element having an exposed surface area and a stable, solid composition of a low Z material comprised substantially of beryllium; and
   a coating of at least one layer of a boron hydride composition integrally bonded at the exposed surface area for providing protection for the optical element against degradation.

2. A device as defined in claim 1, wherein the layer of boron hydride composition has sufficient thickness to seal the exposed surface area and to reduce occurrence of pinhole leaks through the optical element.

3. A device as defined in claim 1, wherein the boron hydride composition provides protection against corrosive environments.

4. A device as defined in claim 1, wherein the boron hydride composition is of sufficient thickness to provide protection against abrasive degradation of the exposed surface area.

5. A device as defined in claim 1, wherein the optical element is physically configured as a foil, said exposed surface area comprising at least one surface of the foil.

6. A device as defined in claim 1, wherein the optical element is physically configured as part of an assembly of components having an exposed surface to which the coating has been applied.

7. A device as defined in claim 1, wherein the boron hydride composition comprises an amorphous boron hydride alloy.

8. A device as defined in claim 7, wherein the amorphous boron hydride alloy is represented by the formula a-B:X:H, where X is an optional low Z element having an atomic number less than 15.

9. A device as defined in claim 8, wherein X is nitrogen.

10. A device as defined in claim 8, wherein X is carbon.

11. A device as defined in claim 1, wherein the device includes an intermediate layer of boron hydride bonded between the low Z material and the composition coating.

12. A device as defined in claim 11, further comprising an additional overcoating covering the boron hydride composition, said overcoating comprising an ultrathin layer of low Z material which includes at least one element selected from the group consisting of carbon and silicon.

13. A device as defined in claim 1, wherein the optical element comprises a low Z material which is x-ray transmissive.

14. A device as defined in claim 1, wherein the optical device is attached to a surrounding contiguous supporting structure, said coating layer being bonded over the exposed surface area and on to the surrounding, contiguous supporting structure to prevent electrolytic action between the supporting structure and the beryllium within the optical element.

15. A device as defined in claim 13, wherein the optical device includes a source for x-ray emission.

16. A device as defined in claim 15, wherein the optical device comprises an x-ray diode.

17. A device as defined in claim 1, wherein the optical device comprises an x-ray window for use within an x-ray tube.

18. A device as defined in claim 17, wherein the optical device is configured as a side x-ray window.

19. A device as defined in claim 17, wherein the optical device is configured as an end x-ray window.

20. A device as defined in claim 5, wherein the optical element is a beryllium foil structure configured for use in a side or end window x-ray tube and having transmission characteristics for both (i) long wavelength line radiation and (ii) other x rays created within the x-ray tube.

21. A device as defined in claim 13, wherein the optical device is configured for use in high power, end window spectroscopy tubes having an interior vacuum environment, said device including an x-ray transmissive beryllium foil having sufficient thickness to withstand a required differential pressure between external atmosphere and the vacuum within the interior of the tube.

22. A device as defined in claim 21, further comprising a coating of at least one layer of a boron hydride composition integrally bonded at an external surface area of the foil.

23. A device as defined in claim 13, wherein the optical device comprises a fluid cooled, x-ray transmitting structure for x-ray tubes, said element including an exterior coating of boron hydride composition on a first supporting substrate of beryllium foil, said foil having a thickness sufficient to withstand a differential pressure between the external atmosphere and an interior volume of the tube, said beryllium foil being attached to the tube by means of a vacuum tight seal, said foil having a second coating of boron hydride composition on an interior side of the foil, thereby protecting both foil sides;

said device including a second substrate of beryllium foil enclosed within the interior volume of the tube and the first supporting substrate, said second substrate including a coating of boron hydride composition on at least one side thereof;

said second substrate of foil being positioned with respect to the second coating on the interior side of the first substrate to define a thin fluid passage therebetween to permit flow of liquid coolant in contact with both the first and second substrates.

24. A device as defined in claim 23, wherein the first substrate of beryllium foil is bonded to a corrosion resistant ring, said ring being sealed to the tube body in water-tight configuration to provide the thin fluid passage for liquid coolant, said device further including means for x-ray production through electric bombardment of a target positioned within the internal volume, said fluid passage providing means for cooling the respective first and second substrates to permit greater concentration of radiation greater power output.

25. A device as defined in claim 24, further comprising a liquid coolant flowing within the flow passage, said coolant being a composition which is to be analyzed by x-ray radiation and which is selected from the group consisting of corrosive liquids and abrasive slurries.

26. A device as defined in claim 21, wherein the transmissive foil also comprises the end window of a spectroscopy tube.

27. A device as defined in claim 1, wherein the optical device is part of a proportional counter.

28. A device as defined in claim 1, wherein the optical device is part of a Geiger counter.

29. A device as defined in claim 1, wherein the optical device is part of a scintillator with optical detector.

30. A device as defined in claim 1, wherein the optical device is part of a solid state detector assembly.

31. A device as defined in claim 1, further comprising an interdiffusion layer at the exposed surface of the optical element and between the coating and substrate, said interdiffusion layer comprising a dispersion of boron hydride composition within the substrate composition.

32. An optical device for interacting with x-ray radiation, comprising:

an optical element configured for interaction with x-ray radiation as part of an optical system, said element having an exposed surface area and a stable, solid composition of a low Z material; and a coating of at least one layer of a boron hydride composition integrally bonded at the exposed surface area for providing protection for the optical element against degradation.

* * * * *

UNITED STATES PATENT AND TRADEMARK OFFICE
CERTIFICATE OF CORRECTION

PATENT NO. : 5,226,067
DATED      : July 6, 1993
INVENTOR(S): David D. Allred, Fang Yuan and Irwin Rudich It is certified that error appears in the above-identified patent and that said Letters Patent is hereby corrected as shown below:

On the title page: Item [54] and Column 1, line 1, should read --

Coating for Preventing Corrosion to
Beryllium X-Ray Windows and Method of Preparing"--.

Signed and Sealed this

Fifth Day of July, 1994

Attest:

Attesting Officer

BRUCE LEHMAN

Commissioner of Patents and Trademarks